(12) United States Patent
Owen

(10) Patent No.: US 6,388,283 B1
(45) Date of Patent: May 14, 2002

(54) SEMICONDUCTOR MEMORY WITH A STRIP-SHAPED CELL PLATE

(75) Inventor: Richard Owen, Regensburg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/275,834

(22) Filed: Mar. 25, 1999

(30) Foreign Application Priority Data

Mar. 25, 1998 (DE) .......................................... 198 13 169

(51) Int. Cl.[7] .................. H01L 21/108; H01L 29/94; H01L 31/119
(52) U.S. Cl. .................. 257/301; 257/296; 257/305; 257/390
(58) Field of Search ................. 257/301, 296, 257/304, 305, 390

(56) References Cited

U.S. PATENT DOCUMENTS

| 4,630,088 A | | 12/1986 | Ogura et al. |
| 4,961,095 A | | 10/1990 | Mashiko |
| 5,012,308 A | * | 4/1991 | Hieda ........................ 357/23.6 |
| 5,548,145 A | * | 8/1996 | Hamamoto et al. ......... 257/301 |
| 6,211,544 B1 | * | 4/2001 | Park et al. .................. 257/296 |

FOREIGN PATENT DOCUMENTS

EP 0 369 132 A1 5/1990

* cited by examiner

*Primary Examiner*—Steven Loke
*Assistant Examiner*—Douglas W. Owens
(74) *Attorney, Agent, or Firm*—Laurence A. Greenberg; Werner H. Stemer; Gregory L. Mayback

(57) ABSTRACT

The memory configuration has memory cells each with a selection transistor and a trench capacitor. The storage electrode is formed by a substrate region along the trench wall. A cell plate that forms a common opposing electrode for a number of memory cells lies inside the trench. The cell plate is structured in strips on the surface of the substrate. The strips can run parallel to the direction of cell rows or enclose a defined angle (other than zero) with this direction. The arrangement in the form of strips halves the minimum structure width in the region of the cell plate.

3 Claims, 3 Drawing Sheets

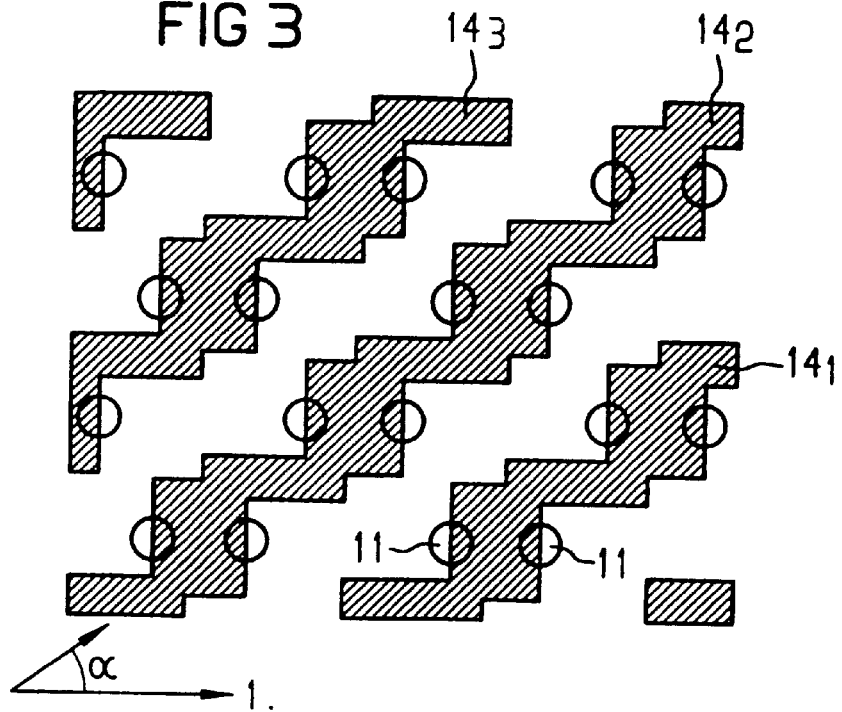
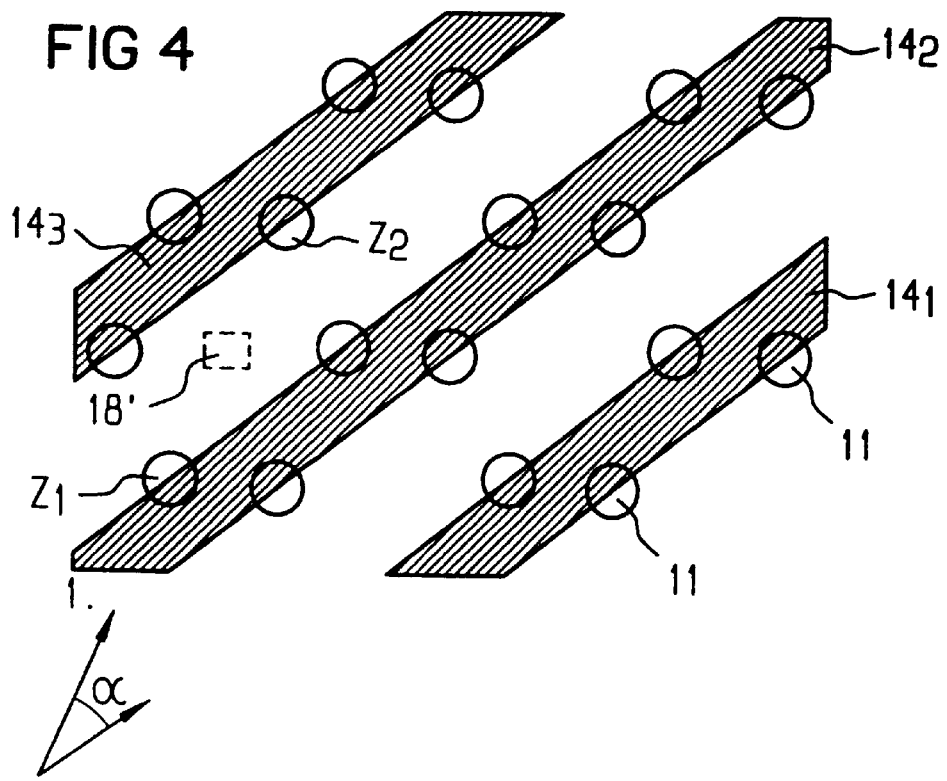

PRIOR ART
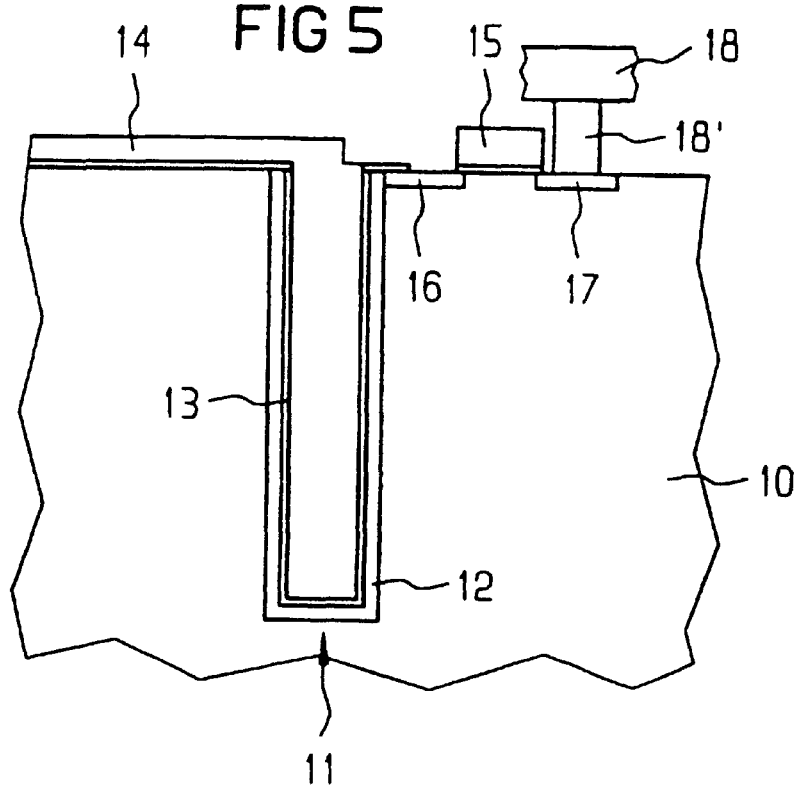
PRIOR ART
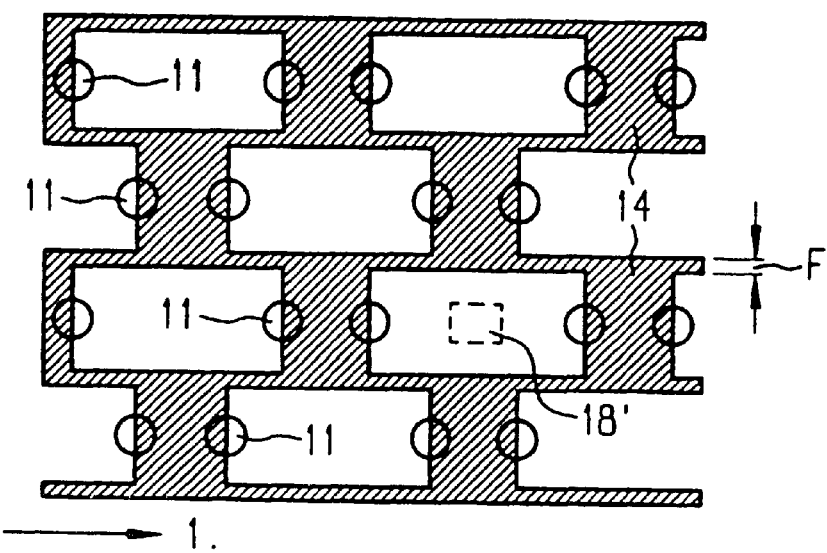

SEMICONDUCTOR MEMORY WITH A STRIP-SHAPED CELL PLATE

BACKGROUND OF THE INVENTION

FIELD OF THE INVENTION

The invention lies in the field of semiconductor technology. Specifically, the invention pertains to a semiconductor memory with a cell plate having a strip configuration.

Semiconductor memories with dynamic random access (DRAM memories) are provided in a great many memory designs. They are generally single-transistor memory cells comprising a storage capacitor for storing a logic variable, and an associated selection transistor. When the selection transistor is driven, via a word line, the information can be written to and read from the storage capacitor. The constantly increasing integration density further requires the space taken up by the single-transistor memory cell to be reduced.

Fundamentally, the cell designs can be divided up as follows:

1. Planar cells, in which both the capacitor and the transistor are produced as planar components;
2. Stacked-capacitor cells, in which the storage capacitor is arranged above the transistor; and
3. Trench cells, in which the transistor is accommodated on the surface of the substrate, the capacitor is accommodated in a trench formed in the substrate and the storage electrode is formed either by the substrate or by a conductive layer arranged in the trench in insulated fashion.

A trench cell, in which the storage electrode is formed by the substrate or part of the substrate, is shown in cross section in FIG. 5. A trench 11 is etched into a substrate 10. A part of the substrate along the inner wall of the trench forms the storage electrode 12 as a result of suitable doping. The inner wall of the trench is provided with a capacitor dielectric 13, and the trench is filled with a layer which usually consists of doped polysilicon and forms the common opposing electrode (cell plate) for a multiplicity of memory cells. The associated selection transistor has a word line 15 arranged on the substrate in insulated fashion, and two S/D regions 16, 17, one (16) of which is conductively connected to the storage electrode 12 and the other (17) of which subsequently makes contact with the bit line 18 via a bit line contact 18'. The memory cells are insulated from one another by insulation regions (e.g. LOCOS or shallow trench insulation). The cell plate 14 has to be structured, i.e. removed from those points on the surface of the substrate at which the selection transistor is formed. The etching used for this purpose may be isotropic or anisotropic. FIG. 6 shows a view of a memory matrix (a detail of a cell area), i.e. a multiplicity of memory cells, with a cell plate 14 (hatched area) structured in this manner.

In the illustrated example, the memory cells are arranged in a row in a first direction, with adjacent rows being offset from one another by the length of a cell. Two respectively adjacent cells in the first direction are arranged with mirror symmetry and have a common bit line contact 18' formed in the middle of the exposed substrate surface. The common bit line contact 18' is shown in only one cell pair for the sake of clarity. In principle, which is to say in layouts other than that shown, as well, the cell plate is structured in network form, with openings which extend as far as the substrate being etched at those points at which one or more (in this case two) transistors are to be arranged. In other words, the holes are practically congruent with the active region, and the remaining cell plate 14 essentially covers the insulation region between the memory cells. In this case, the cell plate fills the trench and at least partly covers the trench at the surface of the substrate.

Such an arrangement cannot be reduced in size indefinitely, because the cell plate is structured photographically and the narrowest network webs therefore have to have at least the width F (minimum dimension that can be produced photographically); with isotropic etching, they can be produced even narrower. If the network webs are very narrow, they can break or tear, so that the affected cells will fail.

SUMMARY OF THE INVENTION

It is accordingly an object of the invention to provide a semiconductor memory, which overcomes the above-mentioned disadvantages of the heretofore-known devices and methods of this general type and which obviates the smallest structural size limit dictated by the network cell arrangement.

With the foregoing and other objects in view there is provided, in accordance with the invention, a semiconductor memory configuration, comprising:

a substrate with a substrate surface and a trench formed therein;

a plurality of memory cells in the substrate, each of the memory cells including a selection transistor, a trench capacitor, and a storage electrode formed by a substrate region along a trench wall of the trench;

a conductive layer inside the trench defining a cell plate forming a common opposing electrode for a number of the plurality of memory cells, the cell plate having a strip structure on the surface of the substrate.

In other words, the novel memory configuration has a cell plate that is not structured in network form but in strips. Hence, the cell plate comprises a number of cell plate strips which run next to one another over the cell area and are connected to one another only right at the edge or outside the cell area—that is to say in a region where there are no memory cells. Between the strips, those regions not covered by the cell plate are likewise present in strip form. The transistors are formed in the uncovered regions. Parts of the insulation region between memory cells (LOCOS or STI insulation) are also located in the open strips.

The narrow webs found in the conventional arrangement (FIG. 6) are dispensed with or may be twice as wide, and the number of these webs is halved. The size of the cell can therefore be reduced further, because the minimal structure produced is twice as wide as in the conventional arrangement.

In accordance with an added feature of the invention, the memory cells are arranged in cell rows in a first direction, parallel to a bit line direction, the cell plate strips run in the first direction, and the cell plate strips each connecting respective capacitors of two adjacent cell rows. In other words, the direction of the cell plate strips can coincide with the direction in which the rows of memory cells are arranged, that is to say with the bit line direction. A plate strip then connects the memory cells from two adjacent cell rows in that it covers these two cell rows in the manner of a double comb. In this case, the capacitor trenches are at least partly covered, whereas the transistor regions remain open. The adjacent cell plate strip connects the storage capacitors from a third and a fourth cell row, and a continuous open strip is located between the cell plate strips.

In this configuration, if two breakage points or similar faults occur in the same cell plate strip, the intermediate cells fail. Such a fault can easily be repaired using redundant cells, however, because only the cells of two bit lines are affected. Hence, using the redundant cells, virtually all that is necessary is simply to replace two bit lines and not a multiplicity of different combinations of bit lines and word lines.

In accordance with an additional feature of the invention, the cell plate strips enclose an angle with the first direction. The angle is understood to be an angle other than zero. Here, the cell plate strip connects memory cells from more than two cell rows, specifically from all the cell rows which it crosses. In each cell row crossed, it is able to connect one or more capacitors, depending on the layout of the memory cells. The advantage of this design is a greater possible packing density.

In accordance with another feature of the invention, the memory cells are arranged in cell rows, the memory cells have a given length, two respectively adjacent memory cells are arranged with mirror-image symmetry with respect to one another in each cell row, and mutually adjacent cell rows are offset from one another by the given length of a memory cell.

In accordance with a concomitant feature of the invention, the cell plate strips are conductively connected to one another in an edge region or outside the cell area.

The invention can be used, in principle, with all layouts of DRAMs with the cell design mentioned (trench cell with a cell plate arranged in the trench), particularly when the offset of the cell rows from one another is different or when the trenches or cells are not arranged with mirror-image symmetry.

Other features which are considered as characteristic for the invention are set forth in the appended claims.

Although the invention is illustrated and described herein as embodied in a semiconductor memory with a cell plate in the form of strips, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 2 to 4 are diagrammatic plan views of further exemplary embodiments of the invention;

FIG. 5 is a partial sectional view taken through a memory cell with a cell plate arranged in the trench; and FIG. 6 is a diagrammatic plan view of a detail of a cell area with a conventional cell plate.

DESCRIPTION OF THE PREFERRED EMBODIMENTS

Figure 1:
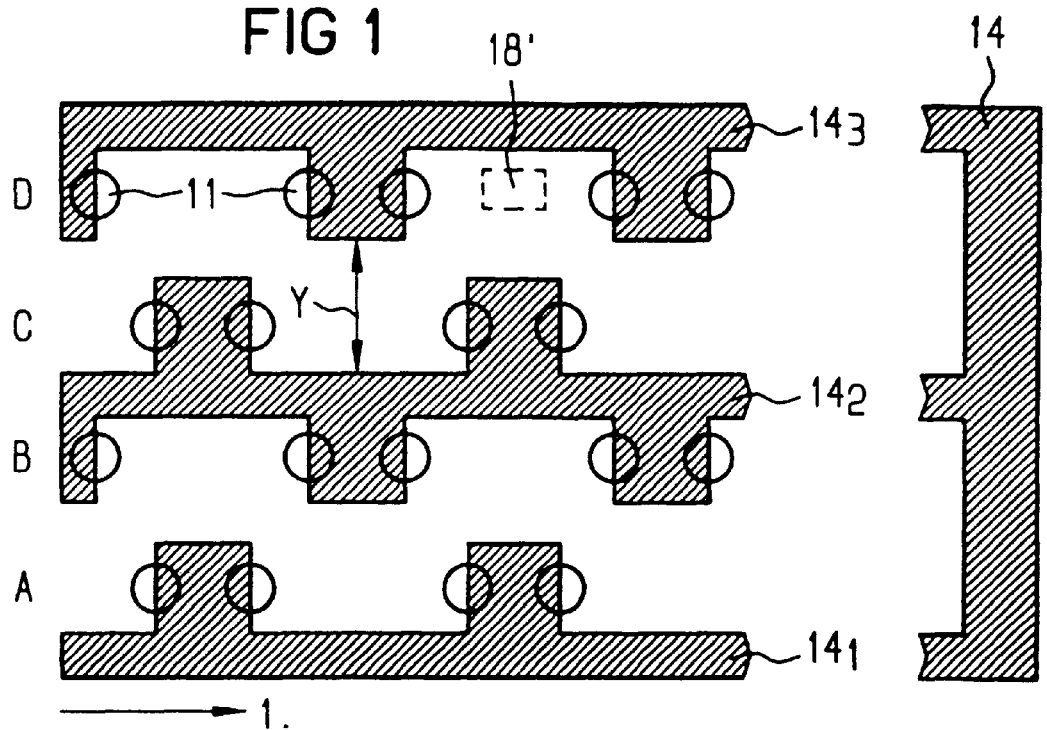
FIG. 1 is a diagrammatic plan view of a detail of a cell area having a cell pate in accordance with a first exemplary embodiment of the invention.

Referring now to the figures of the drawing in detail and first, particularly, to FIG. 1 thereof, the layout of the invention, although it can be used generally, is described with regard to a cell layout having memory cells arranged in rows, two respective adjacent cells being arranged with mirror-image symmetry in a row, and having a cell length/cell row offset.

The cell area detail shows cell rows running in the first direction, labeled A to D. Two respective adjacent cells in a row have a common bit line contact 18' which, for the sake of clarity, is indicated only once, namely in row D. Two respective trenches are also situated in a corresponding manner next to one another and are doped in the substrate with different, but suitably high, levels of doping. Adjacent cell rows are likewise insulated from one another (for example as a result of shallow trench insulation). The cell plate is structured in the form of strips running in the first direction. One cell plate strip $14_2$ connects the capacitor electrodes of the cells in two adjacent rows, rows B and C in this case, whilst an adjacent strip $14_3$ connects the cells from row D (and from a further row outside the illustrated detail). A cell plate strip comprises a central line running in the first direction between the connected cell rows, and has protuberances which at least partly cover the connected capacitor trenches. A cell plate strip thus has a double-comb-shaped structure. The central line can be twice as wide as a web in the prior art arrangement, without any reduction in the space available for the rest of the circuit—particularly in the width Y of the space without any cell plates. Adjacent cell plate strips $14_2$, $14_3$ are isolated from one another by an open strip, on account of the double-comb shape.

The right-hand half of the diagram shows a detail of the circuit next to the cell area. In this case, the cell plate is continuous, so that all the plate strips $14_1$ are conductively connected to one another. Such a connection is preferably provided on both sides of the cell area. Depending on the arrangement of the memory cells at the edge of the cell area, the cell plate strips may also be connected in the edge region of the cell area itself.

Figure 2:
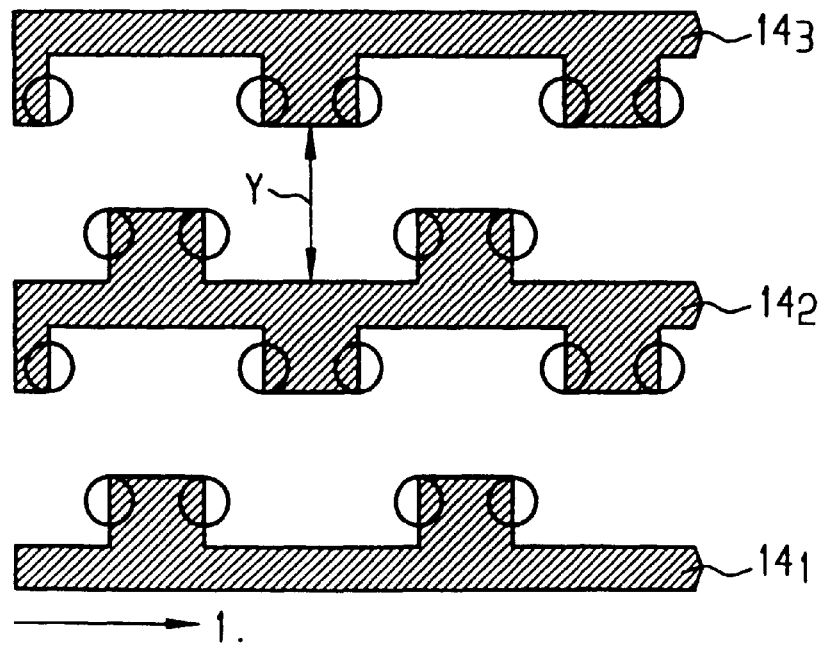

FIG. 2 shows a variant of the exemplary embodiment, in which the surface area of the cell plate 14 and of the cell plate strips $14_1$ has been reduced by omitting electrically ineffective areas. This enlarges the open areas not covered by the cell plate 14, particularly the width Y. The enlarged open areas increase the amount of freedom available for arranging the further memory cell structures in the higher planes, for example the bit line contact.

Referring now to FIG. 3, the third embodiment has cell plate strips $14_1$ that do not run in the direction of the cell rows but run at an angle α with this direction. Hence, each cell plate strip runs over a succession of cell rows and connects at least one—in this case two—capacitor in each cell row. In this case, the shape of a cell plate strip is like a staircase, the particular reason for which is that the active region must remain free for the subsequent method steps (implantation, contacts etc.). In turn, the cell plate strips, which essentially run parallel to one another, are connected to one another at the edge of the cell area. In this example as well, the cell plate strips can be reduced even further in size by omitting electrically ineffective parts.

Referring now to FIG. 4, there is shown an embodiment modified from that in FIG. 3, in which the cell plate strips $14_1$ likewise do not run in the direction of the cell rows but run at an angle a with this direction. In this case, the surface area of the cell plate strip $14_1$ has been reduced, so that the staircase-shaped arrangement merges into diagonal strips. The direction of the cell rows can either be as in the previous examples (that is to say run horizontally in the drawing), or, on the other hand, the cell row direction can also run as shown in the figure (that is to say diagonally and approximately vertically in the drawing); the cell plate strips also form an angle a with this first direction. The bit line contact 18' shown is then allocated to the cells and trenches marked $Z_1$, $Z_2$, and the active, respectively, region runs respectively between the trench and the bit line contact. Such an arrangement can possibly be used to achieve a greater packing density for the cells: the figure shows that the trenches that are adjacent in the 1st direction and have a common bit line contact are at a greater distance apart than the trenches that are adjacent in the horizontal direction (in the context of the figure). In the first direction, it is therefore possible to reduce the size of the grid again. The word lines, which preferably run horizontally (in the context of the figure) in the layout shown, can therefore be laid at an even smaller distance apart. The extent to which the space requirement can be reduced depends, on a case-by-case basis, primarily on what dimensions—particularly the distances between bit line contact and trench, and between gate and trench—are most critical.

The strip structure of the cell plate increases the resistance. This does not generally mean that electrical functions are impaired, however.

The semiconductor memory configuration can be produced using methods which are familiar to a person skilled in the art. The cell plate is preferably produced by full-surface deposition of doped polysilicon and isotropic or anisotropic etching with a photomask. According to the invention, the photoresist layer covers regions in the form of strips as subsequent cell plate strips.

I claim:

1. A semiconductor memory configuration, comprising:
   a substrate with a substrate surface and a trench formed therein;
   a plurality of memory cells in said substrate, each of said memory cells including a selection transistor, a trench capacitor, and a storage elecrode formed by a substrate region along a trench wall of said trench, said plurality of said memory cells configured in cell rows running in a first direction;
   a conductive layer inside said trench defining a cell plate forming a common opposing electrode for a number of said plurality of memory cells, said cell plate having a plurality of strips on said surface of said substrate said plurality of said strips being not connected to each other;
   a gap defined by a region between two neighboring pairs of said plurality of said memory cells; and
   a respective bit line contact being provided for two adjacent cells of two neighboring pairs of said plurality of said memory cells running in said first direction;
   said plurality of strips of said cell plate running in a second direction that is at a non-zero angle with respect to said first direction;
   said memory cells arranged in cell rows in a first direction, parallel to a bit line direction, said cell plate strips running in the first direction, said cell plate strips each connecting respective capacitors of two adjacent cell rows; and
   said memory cells having a given length, two respectively adjacent memory cells arranged with mirror-image symmetry with respect to one another in each cell row, mutually adjacent cell rows being offset from one another by the given length of a memory cell.

2. The memory configuration according to claim 1, wherein said cell plate strips are conductively connected to one another in an edge region.

3. The memory configuration according to claim 1, wherein said cell plate strips are conductively connected to one another outside the cell area.

* * * * *